(12) United States Patent
Bucharelli et al.

(10) Patent No.: US 6,384,488 B1
(45) Date of Patent: May 7, 2002

(54) MODULAR MOBILE POWER CONVERTER

(75) Inventors: Alfred P. Bucharelli, Ridgecrest; Stephen Anthony Preiss, Camarillo; Roy Allen Newcomb, Ridgecrest, all of CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/504,164

(22) Filed: Feb. 15, 2000

(51) Int. Cl.⁷ .................................................. B60L 1/00

(52) U.S. Cl. ........................................ 307/9.1; 307/10.1

(58) Field of Search ................................ 307/9.1, 10.1, 307/64; 363/15, 10, 13

(56) References Cited

U.S. PATENT DOCUMENTS

| | | | | |
|---|---|---|---|---|
| 4,507,720 A | * | 3/1985 | Colbrese | 307/9.1 |
| 4,785,227 A | * | 11/1988 | Griffin | 307/10.1 |
| 5,115,539 A | * | 5/1992 | Lee | 16/35 R |

* cited by examiner

Primary Examiner—Adolf Deneke Berhane
Assistant Examiner—Lawrence Luk
(74) Attorney, Agent, or Firm—Earl H. Baugher, Jr.; Anthony J. Serventi

(57) ABSTRACT

A modular mobile power converter provides filtered and regulated power to specialized electronic systems not able to use local commercial power sources or attain ready access to the required special power source. A particular example is a manually maneuvered power cart that provides 400 Hz power, converted from a 60 Hz source, to specialized avionics and shipborne equipment at locations remote from an appropriate 400 Hz power source.

16 Claims, 3 Drawing Sheets

MODULAR MOBILE POWER CONVERTER

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

The invention pertains to power converters operating remotely from a conventional source of power. In particular, the invention is for a modular mobile power converter suitable for use in both military and industrial applications.

BACKGROUND

As more systems convert from mechanical or hydraulic, including pneumatic, operation to electrical control, and then to digital control using embedded computers, the need to set up, program and test these systems immediately prior to deployment has grown. The problem is further compounded with the complex software and test instrumentation now used. All of these systems do not operate on the same power grid as our homes and offices. For example, airborne systems have traditionally used 400 Hz, 3-phase power. Setup and testing of systems designed to use unconventional power requires a matching unconventional power source. These power sources are found onboard the aircraft or in some hangars, maintenance depots, and precision measurement laboratories, but many times not where the system is being prepared for loading onto an operational platform. These locations include flight lines at forward deployment sites and munitions ready areas onboard a ship. Because the systems need programming and testing immediately prior to deployment, the "ready time" or "turn time" of an aircraft wing or carrier battle group is adversely impacted by having to set up instrumentation at a location remote from the operational platform. Specific examples are provided below.

The current generation of MIL-STD 1760 programmable weapons (guided munitions and missiles such as the Joint Direct Attack Munition (JDAM), and the Joint Standoff Weapon (JSOW) require testing and or reprogramming just prior to loading on attack aircraft. The test sets that perform this function (AN/GYQ-79) rely on 400 HZ electrical power that is not readily available where buildup and testing of munitions is performed. This is especially true aboard conventional and nuclear powered aircraft carrier second deck ordnance transfer areas, or the G-3 Ordnance Shop. A preferred embodiment of the present invention facilitates the testing and re-programming of weapons by providing test set users a Mobile Power Converter (MPC) that quickly, and silently converts single phase or 3-phase 50 or 60 Hz power (from commercial sources or shipboard outlets) to 400 Hz power for proper test set operation.

These MPCs were designed to be used on board CV/CVNs, LHAs, and LHDs as a modular, low cost, interim work around until NAVSEA completes ship alterations providing permanent power supplies in weapons transfer or buildup areas. Once the planned ship alterations were completed, the MPCs that were shipboard would be transferred to other Navy and Marine Corps activities as needed. However, Ordnance Handling Officers aboard some ships have other uses for the MPCs since it expands the capability to perform Internal Built-in-Test (IBIT) or re-programming operations in other parts of the ship or on other weapons at the same time that the fixed capability is in use.

The previously unstated need for a mobile power converter has since expanded to Naval Air Stations (NAS), Naval Weapons Stations (NWS), Naval Air Maintenance Training Groups (NAMTRAGRU), Marine Corps Air Stations (MCAS), Marine Air Logistics Squadrons (MALS), Test & Evaluation facilities and other activities. Pending completion of the ship alterations, and possible use at shore based activities, more MPCs are needed to support the growing inventory of other MIL-STD 1760 (smart weapons). The Air Force has also expressed a strong interest in the MPC for support of their weapons programs.

BRIEF SUMMARY OF THE INVENTION

Provided is the capability to supply filtered and regulated power of the proper type to selected devices for support of remote handling operations of systems requiring other than conventional or locally available power. The system allowing this capability is mounted on a mobile platform that can be self-powered or manually maneuvered, depending on local requirements.

In a preferred embodiment of the present invention, a commercially available power converter is mounted on a heavy-duty commercially available pushcart, using specially fabricated attachments. Specially fabricated cables and connectors and commercially available adapters meeting the requirements of the user are provided with the cart or attached to panels thereto. To protect any pre-programmed information installed in the power converter, a specially fabricated panel is also provided with the cart. Finally, as an option, the cart may be provided with a power generator suitable for operation using a variety of fossil fuels as dictated by the user. In addition to the above possible configurations (with or without generator), the cart will be sized to have the capacity to carry the number and types of test and setup instrumentation required by the user.

With facility power alterations costing up to $50 K per facility, the MPCs priced in the $10–$20K range (depending on modules included in the delivered item), will produce savings running into the millions over their useful operational life. In addition to shipboard operations, this MPC can be used virtually anywhere ashore at a much lower cost than a fixed base installation. An example of the savings is the cost difference between the two power sources $48,000.00 for a shore based, fixed installation versus $10,000.00 for a MPC.

$38,000.00 savings per facility using the MPC, in combination with the test set.

An estimated $30K savings per site at 400 locations yields a $12M return for the Navy alone. Depending on acceptance of MPCs throughout the government and civilian sectors, cost savings could run to several hundred million.

A prime advantage of a preferred embodiment of the present invention is its mobility. For example, using applicant's cart, one can bring the setup and testing instrumentation for sophisticated avionics to the platform on which the avionics will be operating and support timely "turn times" in both simulated and actual combat environments. Testing at the user's platform also permits more timely troubleshooting of any anomalies that are discovered.

In summary, a preferred embodiment of the present invention has the following advantages:

provides power of a type and quality to operate sophisticated electronics systems suitable for use with state-of-the-art military systems allows test and setup at a remote location mobile source self-contained power source man maneuverable package requiring no external motive force fits in tight spaces easily transportable over great distances by standard transport mechanisms long service life and easily maintainable uses commercial off the shelf (COTS) parts inexpensive easy to operate and to train to use modular with ease of reconfiguration and upgrade availability of components, connectors, and adapters suitable for worldwide use adjustable for ergonomics of expected user and environment strength to weight ratio optimized Potential applications of the MPC include powering aircraft test sets on the flight line or in aircraft maintenance areas. This permits maintenance on large aircraft outside an aircraft hanger. This MPC can also facilitate maintenance of a depot's aircraft test equipment since it can be rolled to any location, and power any device requiring non-standard power. The MPC is also suitable for use in small lab environments, or for remote operations in the field, absent station support. Wherever a requirement for non-standard power exists, the MPC can be used.

DETAILED DESCRIPTION

The Mobile Power Converter (MPC) was conceived and built to support the introduction of the latest generation of smart weapons aboard aircraft carriers (CV/CVN), and amphibious assault ships (LHA/LHD).

A preferred embodiment of the present invention permits testing and reprogramming of MIL-STD 1760 weapons (smart weapons) ashore and afloat, in areas not previously capable of supporting munitions/armament testing operations due to the lack of locally available 400 Hz electrical power. Low cost, modular, ruggedized, commercial off the shelf (COTS) components convert commercial 60 Hz electrical power to the 400 Hz power needed for armament test sets such as those capable of being performed with the AN/GYQ-79 Digital Computer Set.

The mobility of the platform can be enabled in a simple handtruck, a small floating platform or raft, an all-terrain-vehicle, a truck, a trailer, or a simple, but rugged handcart. Although the following example explains applicant's concept as applied to a handcart, it is to be understood that the concept is applicable to a wide variety of mobile platforms.

EXAMPLE

Figure 1:
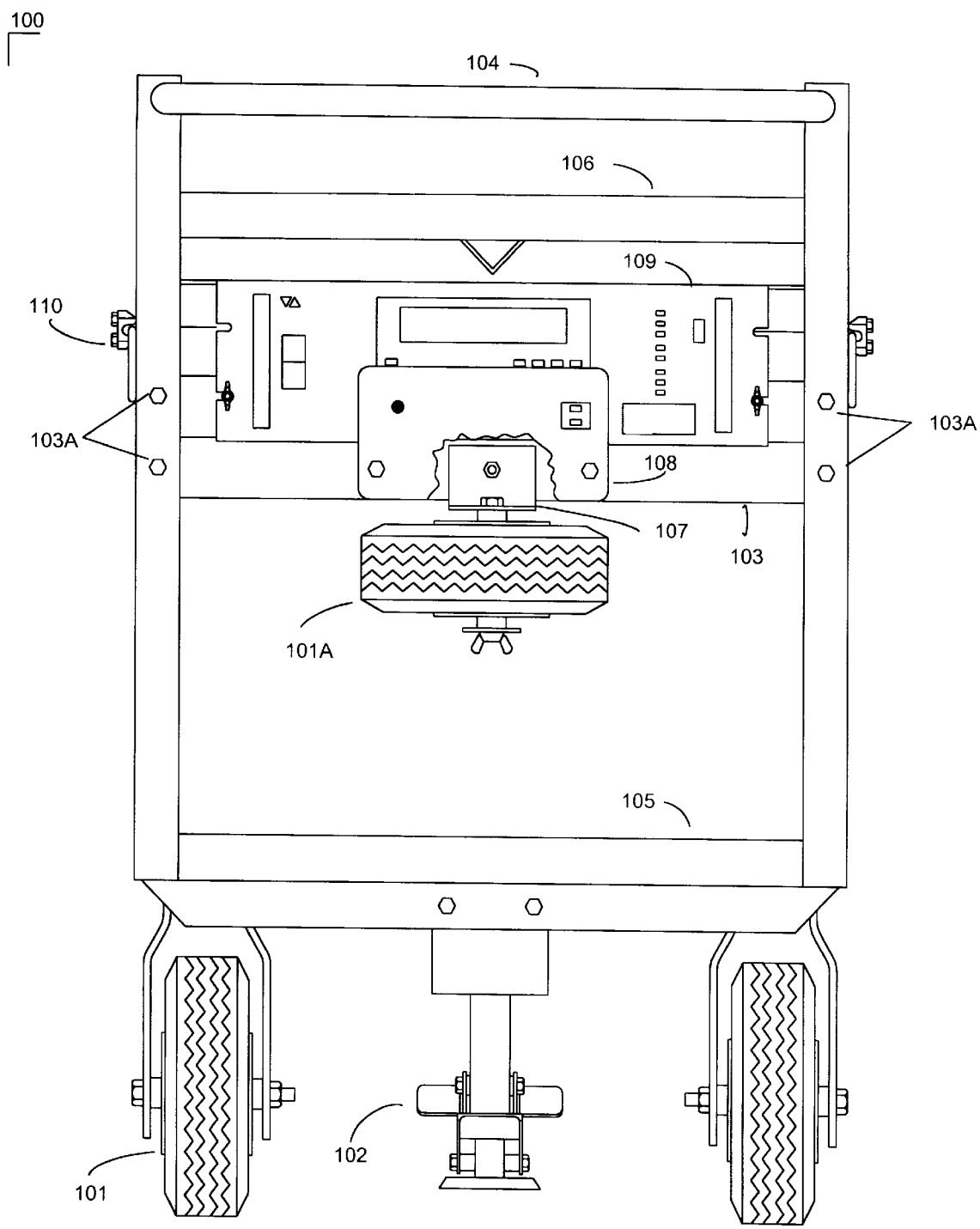
FIG. 1 is an end view of a preferred embodiment of the present invention with only a power supply/converter installed.
Figure 2:
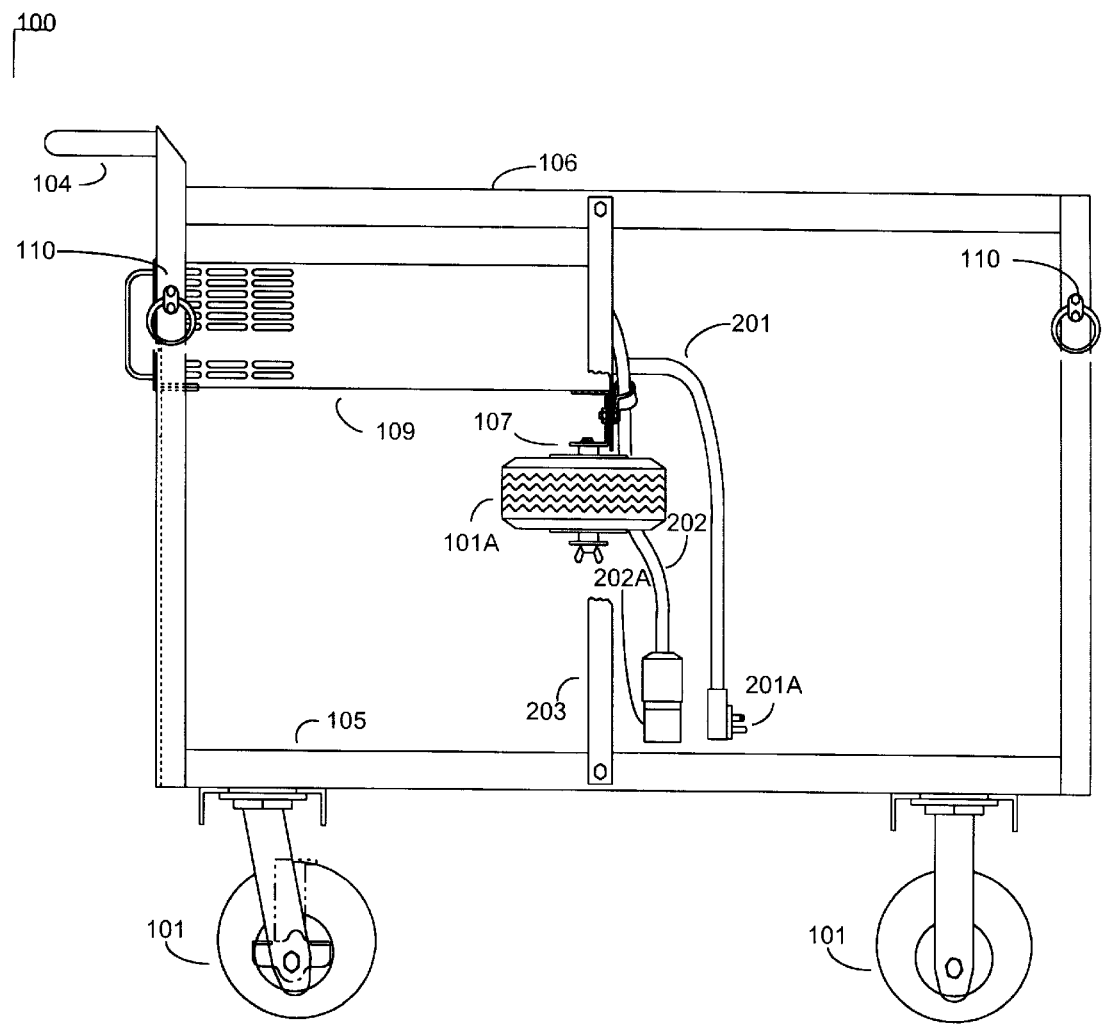
FIG. 2 is a side view of a preferred embodiment of the present invention.
Figure 3:
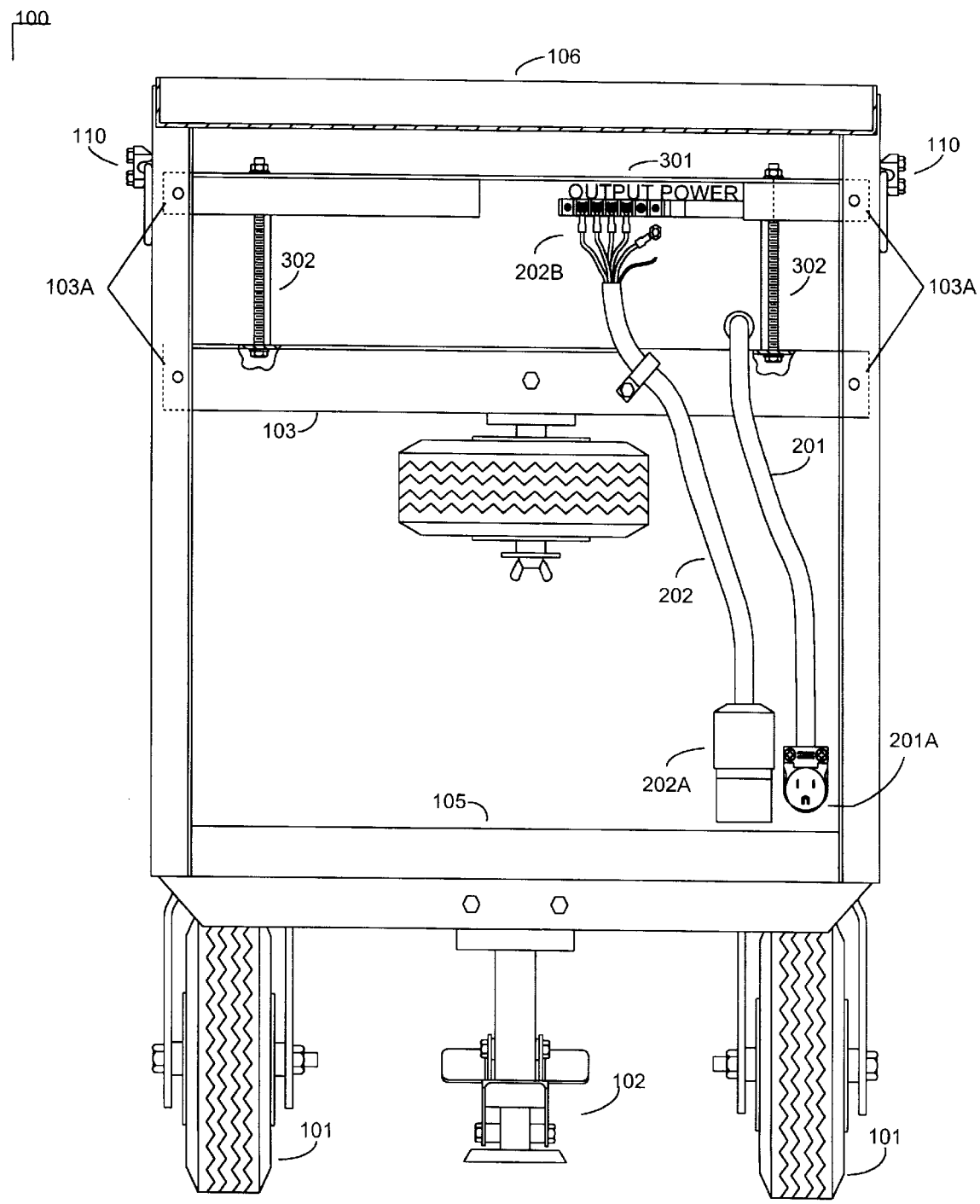
FIG. 3 is an end view of a preferred embodiment of the present invention showing input and output connections and wiring.

Referring to FIG. 1, an end view of a wheeled handcart 100 having 4 wheels 101, two of which are swivel-mounted, a push handle 104, and a spare wheel 101A is shown. Mounted in a pullout bracket 103 on the handcart 100, using attachments 103A and 110, is a power converter 109 and a safety control panel 108. Also shown on the cart are shelves 105 and 106 and manual brake 102. Not shown in FIG. 1 but shown in FIG. 2, a side view of the handcart 100, are the power cables 201 and 202 with connectors 201A and 202A, as specifically setup for a user's requirements. Shown in FIG. 3 is an end view of the end of the handcart 100 opposite that containing the power converter 109. A panel 301 houses the connector 202B for power output and guides the input cable 201 to the power converter 109. As can be seen from the side view of FIG. 2, the top shelf 106 of the handcart 100 is available for the user's test and setup instrumentation and the bottom shelf 105 also has available volume for additional instrumentation (not shown) or a small portable power generator (not shown).

A preferred embodiment of the present invention uses commercial-off-the-shelf (COTS) parts that consist of:

a. Pacific Power Source Converter, specifically, the SmartSource Model 315AX and the Power Converter UPC-3 Controller, manufactured by Pacific Power Source Corporation of Huntington Beach, Calif.

b. Mobile Instrument Cart with Brake and Spare Wheel/Tire manufactured by Brennan Equipment and MFG Co. University Park Ill.

c. 60 Hz plug for power source converter input power, custom fabricated locally from COTS parts.

d. Power supply output cable with connector, custom fabricated locally from COTS parts.

e. Power supply extension cord with male Navy salt water plug (Shipboard use only), custom fabricated locally from COTS parts.

f. Various mounting brackets, custom fabricated locally from COTS parts.

Note: In this embodiment, just prior to use, the Pacific Power Source power converter/controller requires programming of the input and output power ranges.

In this configuration, the mobility of the MPC, allows the user to convert 60 Hz power to 400 Hz power for use with weapon system test sets and weapons from virtually any 60 Hz outlet in the vicinity of the weapons transfer areas and weapons elevators. Because of the MPC, the Navy and Marine Ordnancemen aboard ship are now able to perform their mission and new weapons are made readily available for the Carrier Air Groups. Highlighting the operational usefulness of this particular embodiment of applicants' invention as applied to but a single test set, the AN/GYQ-79, are smart weapons systems currently supported.

TABLE 1

Currently supported weapons.

| | |
|---|---|
| Joint Direct Attack Munition (JDAM) | Joint Standoff Weapon (JSOW) |
| Guided Bomb Units-24 (GBU-24) w Hard Target Smart Fuze | AJM-9X |

The MPC, in combination with the AN/GYQ-79 test set will potentially support the following Navy/USMC MIL-STD 1760 (smart weapons):

TABLE 2

| Potentially supported USN/USMC weapons | |
| --- | --- |
| Joint Direct Attack Munition Extended Range (JDAMER) | Advanced Anti-Radiation Guided Missile (AARGM) |
| Guided Bomb Units-24 (GBU-24) w/ Hard Target Smart Fuze (HTSF) | AIM-9X |
| SLAMER | JASSM |
| AMRAAM | DAMASK |
| AWM-100 Test Set | |

The MPC, in combination with the AN/GYQ-79 test set will potentially support the following USAF MIL-STD 1760 (smart weapons):

TABLE 3

| Potentially Supported USAF Weapons | |
| --- | --- |
| Joint Direct Attack Munition Extended Range (JDAMER) | Miniature Air Launched Decoy (MALD) |
| Guided Bomb Units-24 (GBU-24) w/ Hard Target Smart Fuze (HTSF) | Wind Corrected Munition Dispenser (WCMD) |
| AGM-142 | JASSM |
| PAVEWAY | AIM-9X |

Although not separately shown, a preferred embodiment of the present invention includes those modules, i.e., connectors, attachments, adapters, and available power converters, to meet an individual user's requirements and is not limited to that shown in the drawings or described in the specification.

We claim:

1. A modular mobile power converter comprising:
    a conveyance, wherein said conveyance is a cart;
    a power converter supported upon said conveyance;
    a connector for disposition on or adjacent said conveyance, wherein said modular mobile power converter provides a local source of a type of power required by, and not otherwise available for, a device; and
    a capacity for supporting test equipment on said conveyance, wherein said test equipment is selected to meet an individual user's needs.

2. The modular mobile power converter of claim 1 wherein said cart is comprised of a frame, having an upper part and a lower part, to which physically attached are:
    a means for directing said cart;
    a means for securing said cart in a static position;
    a means for reducing effort needed to propel said cart;
    a means for supporting a power converter having an input and an output;
    a means for connecting to said input of said converter;
    a means for connecting to said output of said converter; and
    a means for supporting material on said cart.

3. The modular mobile power converter of claim 2 further comprising a safeguard plate physically affixed to said upper part of said frame adjacent said power converter,
    wherein said safeguard plate prevents inadvertent reprogramming of said power converter.

4. The modular mobile power converter of claim 1 wherein said cart is a Mobile Instrument Cart with Brake and Spare Wheel/Tire manufactured by Brennan Equipment and Manufacturing Co., University Park, Ill., specially modified to include:
    a slidably removable support for said power converter;
    a slidably removable panel for supporting said input and output connectors;
    a cable with suitable connectors for input to said power converter; and
    a cable with suitable connectors for output from said power converter, and an adapter, wherein said connectors can be affixed to said adapter to enable use of said power converter in additional configurations.

5. The modular mobile power converter of claim 1 wherein said cart, having a frame with upper and lower parts, comprises:
    a handle suitably affixed to the upper part of said frame of said cart;
    a brake suitably affixed to the lower part of said frame of said cart;
    a wheel affixed to the lower part of said cart for rolling said cart, wherein if more than two said wheels are affixed to the cart at least one wheel will be affixed to said cart via a swivel mounting;
    a physical support affixed to said frame of said cart for holding a power converter;
    an electrical connector affixed to said cart for input to said converter;
    an electrical connector affixed to said cart for output from said converter; and
    a flat surface for carrying objects on said cart.

6. The modular mobile power converter of claim 1 wherein the power converter comprises a Pacific Power Source Converter SmartSource Model 315AX and the Power Converter UPC-3 Controller, manufactured by Pacific Power Source Corporation of Huntington Beach, Calif.

7. The modular mobile power converter of claim 1 wherein said connector comprises:
    a first cable having two ends, with a first end having a first individual connector suitable for mating to an input to said power converter and a second end having a second individual connector suitable for connection to a commercially available power source; and
    a second cable having two ends, with a first end having a first individual connector suitable for mating to an output from said power converter and a second end having a second individual connector suitable for connection to a device requiring specialized power,
    wherein said combination of first and second cables with first and second individual connectors is selected to meet individual requirements of the user.

8. The modular mobile power converter of claim 7 in which said first and second individual connectors of said first and second cables have a suitable adapter affixed to at least one of said connectors,
    wherein said combination of said connectors and said adapters is selected to meet individual requirements of the user.

9. The modular mobile power converter of claim 1 wherein said connector comprises
    a first individual adapter having two ends, a first end suitable for mating to an input to said power converter and a second end suitable for connection to a commercially available power source; and
    a second individual adapter having two ends, a first end suitable for mating to an output from said power converter and a second end suitable for connection to a device requiring specialized power, wherein said combination of first and second adapters is selected to meet individual requirements of the user.

10. The modular mobile power converter of claim 1 wherein said conveyance is selected from the group consisting of: a skid, a sled, a waterborne vehicle, an all-terrain-vehicle, and a trailer.

11. The modular mobile power converter of claim 1 further comprising a capacity for supporting a portable generator on said cart,
   wherein, said generator autonomously supplies electrical power to said converter.

12. The modular mobile power converter of claim 11 wherein said generator is fueled by a source selected from the group consisting of: gasoline, diesel fuel, natural gas, propane, and liquefied natural gas (LNG).

13. The modular mobile power converter of claim 1 wherein said connectors are selected from the group consisting of: a U.S. Navy saltwater connector; a three-prong, with ground wire, single phase 220 volt AC connector; a three-prong, with ground wire, single phase 110 volt AC connector; a 400 Hz 3-phase aircraft power supply connector; a DC connector; and a 50 Hz European 220 volt AC connector.

14. A method for converting power from an available type to a required type, in order to energize a device at a remote location, comprising:
   providing a power converter;
   providing a suitable interface between said power converter and an external power source; and
   matching connectors from said device to said power converter;
   providing a mobile platform, having a frame with upper and lower parts, for supporting said power converter;
   providing suitable connectors to match said external power sources to said power converter;
   providing suitable connectors to match said power converter to said device;
   providing adapters to permit support for multiple power sources and devices;
   providing a safeguard plate physically affixed to said upper part of said frame adjacent said power converter, wherein said safeguard plate prevents inadvertent reprogramming of said power converter.

15. The method of claim 14 further comprising providing a portable generator suitable for emplacement on said mobile platform,
   wherein said portable generator is fueled by a source selected from the group consisting of: gasoline, diesel fuel, natural gas, propane, and liquefied natural gas (LNG).

16. The method of claim 14 further comprising providing connectors and adapters so as to permit interconnection among power sources, the device, and said power converter,
   wherein said utilized connectors are selected from the group consisting of: a U.S. Navy saltwater connector; a three-prong, with ground wire, single phase 220 volt AC connector; a three-prong, with ground wire, single phase 110 volt AC connector; a 400 Hz 3-phase aircraft power supply connector; a DC connector; and a 50 Hz European 220 volt AC connector.

* * * * *